United States Patent [19]

Hoyler et al.

[11] Patent Number: 4,940,568
[45] Date of Patent: Jul. 10, 1990

[54] ARRANGEMENT FOR THE CONTINUOUS MELTING OF GRANULATED SILICON FOR A BAND-DRAWING METHOD

[75] Inventors: Gerhard Hoyler, Munich; Josef Grabmaier, Berg; Richard Falckenberg, Wald; Bernhard Freienstein, Munich, all of Fed. Rep. of Germany

[73] Assignee: Siemens Aktiengesellschaft, Berlin and Munich, Fed. Rep. of Germany

[21] Appl. No.: 257,522

[22] Filed: Oct. 14, 1988

[30] Foreign Application Priority Data

Oct. 27, 1987 [DE] Fed. Rep. of Germany ....... 3736339

[51] Int. Cl.$^5$ .................... C30B 35/00; C30B 15/02; B65G 31/00; A01C 17/00
[52] U.S. Cl. .................... 422/245; 156/617.1; 156/620.1; 156/620.4; 198/640; 198/642; 239/687; 239/688; 422/248; 422/249; 422/253
[58] Field of Search ............... 156/617.1, 620.1, 620.2, 156/620.3, 620.4, 622, DIG. 64, DIG. 88; 422/245, 246, 251, 253, 248, 249; 198/639, 640, 642; 239/687, 688, 689

[56] References Cited

U.S. PATENT DOCUMENTS

| | | |
|---|---|---|
| 3,387,792 | 6/1968 | Van der Lely et al. ............ 239/688 |
| 3,473,739 | 10/1969 | Singleton ............ 239/688 |
| 3,780,887 | 12/1973 | Bottoms ............ 239/688 |
| 3,954,551 | 5/1976 | Cecil et al. ............ 156/620.1 |
| 4,289,571 | 9/1981 | Jewett ............ 156/617.1 |
| 4,389,377 | 6/1983 | Duncan et al. ............ 156/DIG. 84 |
| 4,437,613 | 3/1984 | Olson ............ 239/688 |
| 4,478,880 | 10/1984 | Belouet ............ 156/622 |
| 4,563,979 | 1/1986 | Falckenberg et al. ............ 156/620.1 |
| 4,664,745 | 5/1987 | Falckenberg et al. ............ 156/617.1 |

FOREIGN PATENT DOCUMENTS

| | | |
|---|---|---|
| 0170119 | 2/1986 | European Pat. Off. ......... 156/617.1 |
| 3136454 | 3/1983 | Fed. Rep. of Germany ... 156/617.1 |
| 3322685 | 12/1983 | Fed. Rep. of Germany ...... 156/622 |

*Primary Examiner*—Gary P. Straub
*Attorney, Agent, or Firm*—Hill, Van Santen, Steadman & Simpson

[57] ABSTRACT

For the continuous melting of silicon granulate for a band drawing method, a melt reservoir in communication with the melt crucible based on the principle of communicating vessels, is provided in the form of a thermally insulated, annular crucible in whose center axis a rotary plate to be centrifugally accelerated is arranged, the speed thereof being continuously varied. Two pipe parts connected to one another at an angle between approximately 45° to about 90° are secured on the rotary plate, the one, vertical pipe part thereof serving as admission in the rotational axis and the other pipe part thereof forming the acceleration path for the granulate particles in the direction toward the annular melt crucible. On the basis of this arrangement, a uniform delivery and melting of the granulate particles in the melt surface is achieved and, thus, a continuous silicon band drawing with uniform layer thickness is enabled. The arrangement is used in the manufacture of silicon bands for solar cells.

20 Claims, 2 Drawing Sheets

ARRANGEMENT FOR THE CONTINUOUS MELTING OF GRANULATED SILICON FOR A BAND-DRAWING METHOD

BACKGROUND OF THE INVENTION

The present invention is directed to an arrangement for the continuous melting of granulated silicon in a melt reservoir that, based on the principle of communicating vessels, is in communication with a melt crucible for the continuous, horizontal drawing of silicon bands.

An arrangement, as well as, an apparatus and a method for the manufacture of band-shaped silicon crystals having horizontal drawing direction is disclosed in European Patent application 0 170 119.

Pursuant to this method (referred to as S-web method), and with this apparatus, silicon bands can be drawn from a silicon melt with a high drawing speed (about 1 meter per minute). In order to fully exploit, economically, the possibilities of the method, it is necessary to operate the drawing process continuously over several hours or days. A critical prerequisite therefor is that the surface of the silicon melt, in the crucible from which the silicon band is drawn, maintains a constant level during the entire duration of the drawing process.

The problem of maintaining a constant level, is that silicon raw material must be continuously supplied to the crucible without thereby disturbing the band drawing process. For example, the continuous delivery of about 350 g silicon per minute is required for a band that is 30 cm wide and 0.5 mm thick given a drawing speed of 1 meter per minute.

Silicon raw material is available in the form of granules. Since the density of solid silicon is lower than that of molten silicon, the granules float when scattered onto the melt, without being submersed therein. The heat transmission from the melt into the granules is therefore poor. This results in the accumulation of unmelted granules on the melt, under the filling location. The heat transmission within the accumulated granules is even poorer than the transmission between the melt and individual granules. In the known melt-down methods of the iron and steel industry, the delivered material sinks completely into the melt due to the density ratio of the solid to molten substance prevailing therein. This is opposite to that of silicon and the difficulties set forth above therefore do not occur in the iron and steel industry.

For a number of reasons, one can not increase the temperature of the silicon melt to such an extent above the melting temperature of silicon that adequate thermal output is transferred into the granules, due to a very high temperature gradient even given poor heat transmission One problem is that the quartz used to construct the melt and drawing crucible becomes increasingly mechanically unstable at temperatures above the melting point of silicon. With increasing temperature, the rapidity of the chemical reaction between quartz and molten silicon increases, this leads to silicon oxide being created that evaporates out of the melt given the high temperatures prevailing, and forms carbon monoxide with the highly heated graphite surfaces (the heaters and, covers). Carbon monoxide is in turn dissolved in the silicon melt and thus forms silicon carbide pursuant to the equation:

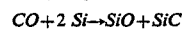

$$CO + 2\,Si \rightarrow SiO + SiC$$

The resultant silicon carbide is incorporated into the silicon bands, and has an extremely deleterious effect on the silicon bands use for solar cells.

SUMMARY OF THE INVENTION

The present invention provides an arrangement that makes it possible to distribute granulated silicon uniformly over the surface of a silicon melt in a required quantity, such that every particle of granulate is surrounded by adequate melt. Accordingly, the required thermal energy is transmitted onto each granulate particle. The thermal output transferred from the melt into the granulate can then be resupplied into the melt by known heating devices.

To this end, the present invention provides an apparatus for the continuous melting of silicon granulate in a melt reservoir that, based on the principle of communicating vessels, is in communication with the melt crucible for the continuous, horizontal drawing of silicon bands. Pursuant to the present invention, the container for the melt reservoir is an annular crubicle having thermal insulation on all of its sides. The crucible includes a slot-shaped opening that allows the granulates to be delivered through the cover. A rotary plate, that is centrifugally accelerated, is located in the center axis of the annular crucible. Means are provided for continuously varying between an upper and a lower limit value the angular speed of the rotary plate. A tubular collecting vessel for the silicon granulate is secured to the rotary plate. The collecting vessel includes an admission for the granulate in the direction of the rotational axis as well as a discharge opening in the direction of the annular melt reservoir.

In an embodiment, the collecting vessel includes a pipe combination having at least two pipe parts, connected to one another at an angle of between 45° to about 90°, whereby that part proceeding vertically in the rotational axis contains an admission for the granulate and the part containing the discharge opening serves as acceleration path for the granulate.

In an embodiment, a pipe combination is used wherein a plurality of acceleration pipes are allocated to one delivery pipe. In an embodiment of the acceleration pipes are arranged in crossed form around a shared delivery pipe.

Preferably, the acceleration pipes have a round, oval, or rectangular cross-section.

In an embodiment, the delivery pipe contains a funnel-shaped filling opening, the silicon granulate is conducted to the delivery pipe via a vibrator means.

In an embodiment, a cone for directing the granulate particles out of the delivery pipe, is arranged in the center of the acceleration pipe.

Additional features and advantages of the present invention will be apparent from the detailed description of the presently preferred embodiments and from the drawings.

DETAILED DESCRIPTION OF THE PRESENTLY PREFERRED EMBODIMENTS

The present invention provides an arrangement for the continuous melting of granulated silicon in a melt reservoir that, based on the principle of communicating vessels, is in communication with the melt crucible for the continuous, horizontal drawing of silicon bands. The advantages of the invention are achieved in that:

a. the container for the melt reservoir is an annular crucible having thermal insulation on all its sides and having a slot-shaped opening that allows the granules to be delivered through cover;

b. a rotary plate, that is centrifugally accelerated, is located at a center axis of the annular crucible;

c. means are provided with which the angular speed or rpm of the rotary plate is continuously varied between an upper and a lower limit value; and d. a tubular collecting vessel for the granulated silicon is secured on the rotary plate, the collecting vessel includes an admission for the granulate in the axis of revolution and also includes a discharge opening in a direction toward the annular melt reservoir.

In an embodiment of the present invention, the collecting vessel includes a pipe combination of at least two pipe parts connected to one another at an angle of between approximately 45° to about 90°. The pipe part extending vertically in the pipe axis contains an admission for the granulate, a second part containing the discharge opening serves as an acceleration path for the granulate. However, it is also possible to use a pipe combination wherein a plurality of acceleration pipes are provided for one admission pipe, whereby the acceleration pipes, for example, are arranged in crossed form around a shared admission pipe.

Figure 1:
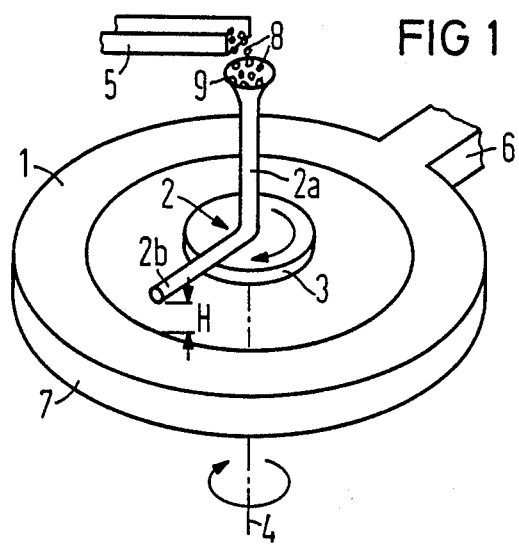
FIG. 1 illustrates a schematic view of the melting crucible arrangement including a rotating granulate delivery of the present invention.

Referring now to FIG. 1, in order to keep the energy consumption low, the melt vessel 7 is thermally insulated, in a technologically known way, such that the energy losses due to heat conduction or, respectively, radiation, are as low as possible. For the sake of clarity, the thermal insulation, as well as the heating equipment for the melt vessel 7 and the drive motor for effecting the rotary motion 4 are not illustrated in FIG. 1.

The problem of uniformly and continuously dispersing silicon granulate 8 onto the melt surface 1, despite thermal shielding, is resolved by the invention due to the following features of the apparatus of the present invention:

1. The melt reservoir is created as an annular melt crucible 7;

2. The granulate particles 8 are accelerated by centrifugal forces due to a rotating arrangement (2, 3, 4), set forth in greater detail below, that the particles describe defined projectile orbits that lead through a slot-shaped opening in the thermal shielding (not shown) to the melt surface 1;

3. The delivery of the granulate 8 proceeds in the axis of the rotatory equipment (2, 3, 4); and 4. The angular speed of the rotary equipment (2, 3, 4), varies continuously between a lower and an upper limit value, so that the projectile orbits of the granulate particles 8 sweep the entire width of the annular melt crucible or vessel 7.

An acceleration pipe for the delivery of the granulate particles 8 is referenced 2, and is secured on a rotary plate 3 that rotates around a shaft 4. The acceleration pipe includes part 2b having a discharge opening that is located at a height H above the melt level 1. The delivery of the granulate 8 to the acceleration pipe 2b, proceeds via the pipe part 2a that includes a filling opening 9, that turns concentrically relative to the shaft 4 under the vibrator 5. Reference character 6 indicates the connection of the annular melt crucible 7 to the drawing crucible (not shown in FIG. 1) from which the silicon band is drawn. Preferably, the acceleration pipe 2b has a round, oval, or rectangular cross-sectional structure that is dimensioned such that the granulate particles 8 moving therein do not block the pipe.

In an embodiment, instead of a single pipe (2) illustrated in FIG. 1, a plurality of acceleration pipes (2b) can be arranged on the rotary plate 3 The acceleration pipes (2b), for example, can be arranged in crossed form, all of the acceleration pipes can comprise a shared delivery pipe 2a. Preferably, the pipes 2a, 2b are constructed from materials that do not produce any injurious abrasions. Preferably, the pipes 2a and 2b are constructed from quartz or silicon.

The mathematical analysis of the movement of the granulate particles (8) illustrates what further demands are to be made of the acceleration equipment (2, 3, 4). By way of example, the following calculations refer to an arrangement wherein the delivery pipe 2a and the acceleration pipe 2b form an angle of 90°. Although, pursuant to this example, the delivery pipe 2a and the acceleration pipe 2b form an angle of 90°, it should be appreciated, that pursuant to the present invention, they can form angle between approximately 90° to about 45°.

Figure 2:
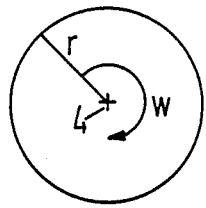
FIG. 2 illustrates the principle of the rotation for the acceleration of the particles.

The granulate particles are considered as mass points in the sense of mechanics, whose extension in space is not considered. Referring to FIG. 2, the particles are freely mobile in a radial direction r in the acceleration pipe 2 that rotates around the shaft 4 with an angular speed w. As a consequence of centrifugal force acting on the particles, they experience acceleration dependent on r. When the frictional forces are not considered, then the following differential equation derives for the particles in the acceleration pipe:

$$r'' - w^2 r = 0 \qquad (1)$$

whereby $r''(t) = d^2r/dt^2$.

The expression (1) illustrates that the motion of the particles is independent of their mass. When the initial conditions are defined as: $t=0$, $r=r_0$ (starting position of the granulate particle) and $r'=0$, then the solution of (1) is:

$$r = \frac{r_o}{2}(e^{wt} + e^{-wt}) \qquad (2)$$

$$r' = \frac{wr_o}{2}(e^{wt} - e^{-wt}) \qquad (3)$$

When the length of the acceleration pipe is $r=r_A$, then the radial velocity $r_A'$ of a particle that exits the acceleration pipe can be derived from (3) as a function of w:

$$r_A' = \frac{wr_o}{2}(e^{wt} - e^{-wt}) \quad (4)$$

For given values $r = r_A$ and $r_o$, the product wt has a fixed value as a solution of (2), so that the parenthetical expression in (4) likewise has a fixed value.

Figure 3:
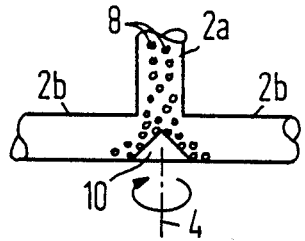
FIG. 3 illustrates a cross-sectional view through an embodiment of an admission pipe.

It follows from (4) that a granulate particle (8) that lies at $r_o = 0$ does not experience any movement. To prevent a granulate particle from not moving, as illustrated in FIG. 3, a cone 10 is positioned in the center of the acceleration pipe 2b at r=0. The cone 10 deflects particles 8 dropping in the delivery pipe 2a from the location r=0.

Figure 4:
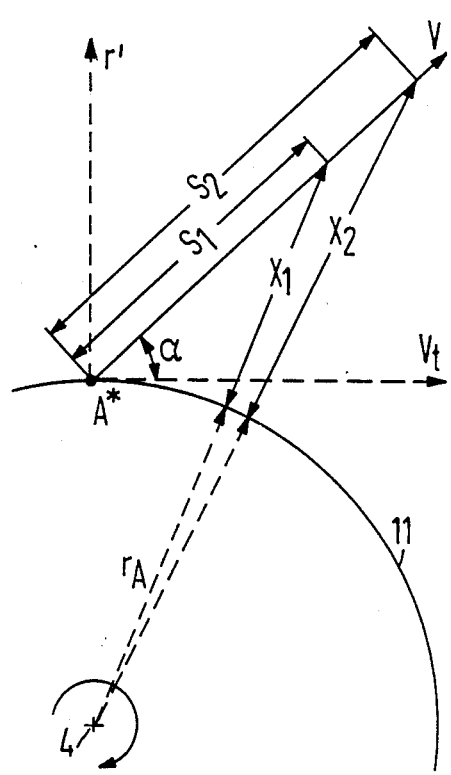
FIG. 4 illustrates a vertical projection of the motion event onto the melt level.

Referring now to FIG. 4, in addition to the radial velocities $r_A'$, a granulate particle exiting the acceleration pipe also includes a tangential velocity $v_t = w \cdot r_A$. The velocities $r_A'$ and $v_t$, combine to form a resulting velocity v:

$$v = \sqrt{r_A'^2 + v_t^2} \quad (5)$$

FIG. 4 illustrates a vertical projection of the motion event onto the melt level. A* is the projection of the firing point A that is situated at a height H above the melt level (1); (see FIG. 1). The circle, that the end of the acceleration pipe (2b) describes around the shaft 4, is referenced 11. Valid for the angle $\alpha$ is:

$$\tan\alpha = \frac{r_A'}{v_t} = \frac{e^{wt} - e^{-wt}}{e^{wt} + e^{-wt}} = \tanh(wt) \quad (6)$$

The quantity wt has a fixed value, independent of w for given values of $r_A$ and $r_o$ as a solution of (2); according to (6), $\alpha$ is thus also fixed.

A granulate particle that exits the acceleration pipe (2b) at point A (projection A* in FIG. 4) horizontally with a velocity v following from (5) describes a parabola whose projection s onto the melt level (1) forms the angle $\alpha$ with a tangent at the circle 11. When H is the casting height of the point A above the melt level (1). then the particle strikes the melt surface following a trajectory path s:

$$s = v\sqrt{\frac{2H}{g}} \quad (7)$$

g = acceleration due to gravity
= 981 cm/s²

As the FIG. 4 illustrates, the trajectory path s is not identical to the radial distance x of the particle striking the melt that is of interest for the practical case namely the radial distance x from the circle 11 that is defined by the rotating discharge opening of the acceleration pipe 2b. x derives from (the triangle having the sides s,$r_A$ and $x + r_A$ as well as the angle ($\alpha = 90°$):

$$x = \sqrt{r_A^2 + s^2 + 2r_A s \sin\alpha} - r_A \quad (8)$$

In (8), $r_A$ and $\sin\alpha$ are fixed values; s is ultimately a function of w via (7) and (5), i.e., the relationship (8) yields x as a function of w. In the following, practical examples, the speed n for which $n = w/2\pi$ applies is used instead of the angular speed w. FIG. 4 illustrates two examples for $r_A = 11$ cm, $r_o = 5$ cm; $\alpha = 41.69°$ derives from (2) and (6) with these values; for the speeds $n_1 = 85$ rpm or, respectively $n_2 = 118$ rpm, the spacing distances $x_1 = 8.5$ cm and, respectively, $x_2$ 12 cm derive according to (8).

Figure 5:
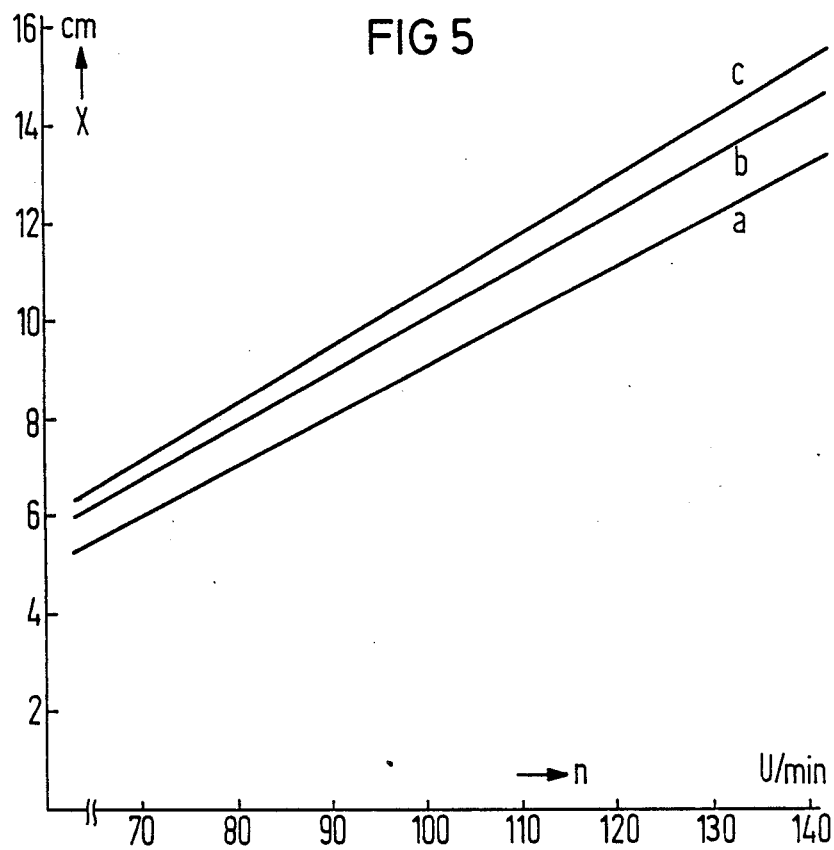
FIG. 5 illustrates a graphic comparison between measured average spacing distances and calculated curves.

FIG. 5 illustrates a comparison between measured average spacing distances x and calculated curves. An acceleration pipe of quartz having a rectangular, clear cross-section of 10 mm x14 mm, $r_A = 11$ cm, H=3 cm was used for the test. The granulated silicon particles had masses between 2 mg and 200 mg. The crosses shown in FIG. 5 are experimental values; the curves are calculated, curve a) $r_o 7$ cm, curve b) $r_o = 5$ cm, curve c) $r_o = 3$ cm. Above about 100 rpm, the experimental measured values approach a linear portion of the curve b). The deviations given lower speed are explained by the fact that the frictional forces are no longer negligible ® given decreasing centrifugal forces.

Figure 6:
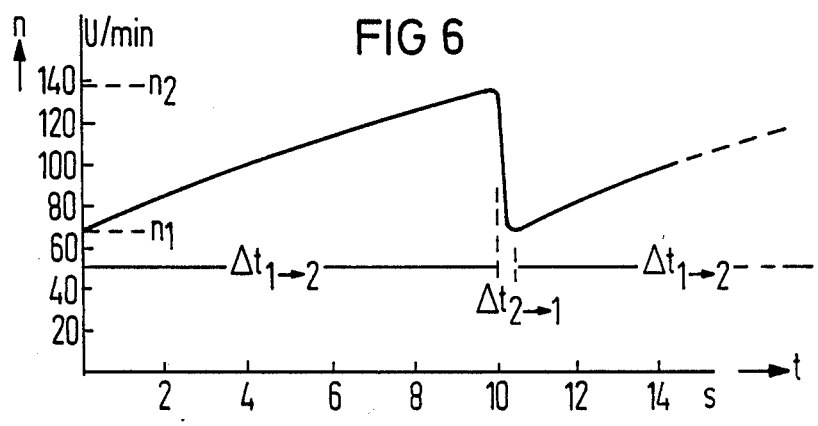
FIG. 6 illustrates the periodic modifications of the rotations per minute.

Referring now to FIG. 6, a uniform coverage of the entire, angular melt surface (1) is achieved, pursuant to the present invention, by periodic changes of the rpm. In a first time period $\Delta t_{1 \to 2}$, the speed n is elevated from a lower value $n_1$ to an upper value $n_2$ according to a time dependency derived below and is subsequently lowered to $n_1$ again in a far shorter time period $\Delta t_{2 \to 1} < \Delta t_{1 \to 2}$.

These two periods constantly repeat. In order to find the time dependency n(t), one proceeds from the requirement that the annular surface elements $dF = 2 \cdot \pi \cdot R \cdot dR$ swept by the granulate stream per time element dt during the period $\Delta t_{1 \to 2}$ should be constant, whereby $R = r_A + x$ (FIG. 4) is the radius of the surface element; what is thus required is:

$$\frac{dF}{dt} = \frac{2\pi R \cdot dR}{dt} = C \quad (9)$$

The constant C is determined by the mass of the granulate dm/dt to be strewn on and to be melted per time unit and is also determined by the surface density $\rho_F(g/cm^2)$ of the strewn layer. Valid are:

$$\frac{dm}{dt} = \frac{d}{dt}(F \cdot \rho_F) = \rho_F \cdot \frac{dF}{dt} \quad (10)$$

$$C = \frac{dF}{dt} = \frac{1}{\rho_F} \cdot \frac{dm}{dt}$$

Following from (9) by integration with the condition that $R = R_1 = r_A + x_1$ should apply for t=0:

$$R = r_A + x = \sqrt{\frac{C}{\pi}t + (r_A + x_1)^2}$$

or $$x = \sqrt{\frac{C}{\pi}t + (r_A + x_1)^2} - r_A. \quad (11)$$

The relationship (11) indicates how the spacing distances x of the granulate stream must change over time in order to achieve a uniform coverage with given quantities C, $r_A$ and $x_1$. In order to achieve such a chronological course x(t), the appertaining time dependency of the speed must be determined. To that end, the result of FIG. 5 is exploited, namely that x and n are roughly linearly interrelated:

$$x \approx a + bn \tag{12}$$

The two constants a, b are taken from the straight lines that can be placed through the experimental points of FIG. 5. (12) inserted in (11), this, yields the time dependency of the speed in the time period $\Delta t_{1 \to 2}$:

$$n(t) = \frac{\sqrt{\frac{C}{\pi} t + (r_A + x_1)^2} - r_A - a}{b} \tag{13}$$

The length of the time period $\Delta t_{1 \to 2}$ follows from (10):

$$\Delta t_{1 \to 2} = \frac{F}{C} \tag{14}$$

When F is the entire melt surface $\Delta t_{1 \to 2}$ must be of such a length that the granulate particles strewn on in this time interval give $R = R_1 = r_A + x_1$ are completely melted. It is thus achieved that the granulate stream always strikes uncovered melt surface.

By way of example, and not limitation, an example of the device will be provided.

An acceleration pipe (2b) having a length $r_A = 11$ cm and a trajectory height that amounts to H=3 cm. The annular melt surface has an inside radius $R_1 = 16$ cm and an outside radius $R_2 = 25$ cm. In order to reach both of these radii with granulate, the speed n must be varied between $n_1 = 70$ rpm and $n_2 = 140$ rpm, as illustrated in FIG. 5. The granulate mass dm/dt supplied per time unit should equal 350 g/min (this corresponds to a silicon band that is 30 cm wide and 0.5 mm thick given a drawing rate of 1 meter per minute). The surface density of a loosely scattered granulate layer should lie at 0.05 g/cm². Thus deriving from (10) is $$C = \frac{dF}{dt} = \frac{1}{\rho_F} \cdot \frac{dm}{dt} = 117 \text{ cm}^2/s$$

According to (14), the entire melt surface of F=1159 cm² is swept in the time $\Delta t_{1 \to 2} = F/C = 10$ s. The constants a, b of equation (14) derive from FIG. 5 at a = −4.16 cm, b = 8.0 cm/1/s.

Deriving according to (13) for the time dependency of the speed between $n_1$ and $n_2$ is:

$$n(t) = \frac{\sqrt{37{,}24 \frac{\text{cm}^2}{s} \cdot t + 256 \text{ cm}^2} - 6{,}84 \text{ cm}}{8 \frac{\text{cm}}{1/s}}$$

FIG. 6 illustrates that this rise in speed in the time period $\Delta t_{1 \to 2}$ is approximately 10s. In the example set forth in FIG. 6, it was assumed for the time period $\Delta t_{2 \to 1}$ that the speed returns to $n_1$ from $n_2$ in about 0.5 s, whereby the chronological course is not specified in greater detail in this period.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. An arrangement for the continuous melting of silicon granulate in a melt reservoir that, based on the principle of communicating vessels, is in communication with the melt crucible for the continuous, horizontal drawing of silicon bands comprising:
    a container for the melt reservoir, created as an annular covered crucible, having thermal insulation on all sides, and having an opening for granulate delivery through the cover;
    a rotary plate, above the walls of the crucible, located on and perpendicular to the center axis of the annular crucible;
    means for continuously varying between an upper and a lower limit value the angular speed of the rotary plate; and
    a tubular collecting vessel for the silicon granulate is secured on the rotary plate the collecting vessel including an admission for the granulate in the direction of the rotational axis as well as a discharge opening in the direction of the annular melt reservoir.

2. The arrangement of claim 1 wherein the collecting vessel includes a pipe combination of at least two pipe parts connected to one another at an angle of between approximately 45° to about 90°, one pipe part being vertical and on the rotational axis and containing an admission for the granulate and one or more second pipe part(s) connected thereto forming a discharge path(s) for the granulate.

3. The arrangement of claim 2 wherein the pipe combination that is used includes a plurality of discharge paths connected to the one vertical pipe part.

4. The arrangement of claim 3 wherein the discharge paths are arranged in crossed form around a shared delivery pipe.

5. The arrangement of claim 3 wherein a cone for directing the granulate particles out of the vertical pipe, the cone being positioned in the center of the discharge path(s).

6. The arrangement of claim 2 wherein the discharge path(s) have a round cross-sectional shape.

7. The arrangement of claim 2 wherein the discharge path(s) have an oval cross-sectional shape.

8. The arrangement of claim 2 wherein the discharge paths have a rectangular cross-sectional shape.

9. The arrangement of claim 2 wherein the pipe parts are constructed from a compound chosen from the group consisting of quartz and silicon.

10. The arrangement of claim 2 wherein the vertical pipe includes a funnel-shaped filling opening at its upper end.

11. The arrangement of claim 10 wherein a vibrator means is provided, and located above the filling opening, the silicon granulate being conducted to the vertical pipe via said vibrator means.

12. A device for the continuous melting of silicon granulate in a melt reservoir for the continuous horizontal drawing of silicon bands comprising:
    an annular covered crucible, for housing the melt, including thermal insulation and having an opening for the delivery of granulate through the cover of the crucible;
    a rotary plate, above the walls, located on and perpendicular to the center axis of the annular crucible;
    means for continuously varying the angular speed of the rotary plate between an upper and a lower limit value; and a tubular collecting vessel for the silicon granulate, said vessel being secured on the rotary plate, the collecting vessel including an admission for the granulate in a direction of the rotational axis as well as a discharge opening in the direction of the annular melt reservoir.

13. The device of claim 12 wherein the collecting vessel includes at least two pipe parts connected to one another at an angle between approximately 45° to about 90°, one pipe part being vertical and on the rotational axis and containing an admission for the granulate and at least one second pipe part connected thereto forming a discharge path for the granulate.

14. The device of claim 13 wherein the pipe combination includes a plurality of second pipe parts forming discharge paths connected to said vertical one pipe part.

15. The device of claim 14 wherein the discharge paths are arranged in crossed form around a shared delivery pipe.

16. The device of claim 14, including a cone for directing the granulate particles out of said one vertical pipe part, the cone being located in a center of the discharge paths.

17. The device of claim 13 wherein the discharge paths have a round, oval or rectangular cross-sectional shape.

18. The device of claim 13 wherein the pipes are constructed from a compound chosen from the group consisting of quartz and silicon.

19. The device of claim 13 wherein the vertical pipe contains a funnel-shaped filling opening at its upper end.

20. The device of claim 13 including a vibrator means for feeding the silicon granulate is fed to the vertical pipe part.

* * * * *